United States Patent [19]

Gomes

[11] Patent Number: 4,877,981
[45] Date of Patent: Oct. 31, 1989

[54] PRECISION DEVICE FOR SOFT CLIPPING AC AND DC SIGNALS

[75] Inventor: Gary D. Gomes, Newark, Calif.

[73] Assignee: Ampex Corporation, Redwood City, Calif.

[21] Appl. No.: 198,420

[22] Filed: May 25, 1988

[51] Int. Cl.⁴ .............................................. H03K 5/08
[52] U.S. Cl. .................................. 307/555; 307/561; 307/494; 330/110
[58] Field of Search ............... 307/490, 493, 494, 503, 307/551, 555, 559, 565, 257, 321, 561; 330/145, 151, 278, 284, 110

[56] References Cited

U.S. PATENT DOCUMENTS

| | | | |
|---|---|---|---|
| 2,832,886 | 4/1958 | Morrill | 250/27 |
| 3,230,395 | 1/1966 | Dortort | 307/503 |
| 3,480,794 | 11/1969 | Richman | 307/229 |
| 3,621,227 | 11/1971 | Tsuda et al. | 235/197 |
| 3,736,515 | 5/1973 | Kadron et al. | 307/494 |
| 3,776,381 | 12/1973 | Wood | 209/111.6 |
| 3,928,774 | 12/1975 | Wilson | 328/145 |
| 3,932,817 | 1/1976 | Rogers | 328/128 |
| 4,147,989 | 4/1979 | Brolde | 328/142 |
| 4,495,428 | 1/1985 | Ishigaki | 307/494 |

FOREIGN PATENT DOCUMENTS

| | | | |
|---|---|---|---|
| 54-71963 | 6/1979 | Japan . | |
| 0140715 | 11/1981 | Japan | 307/559 |
| 1376961 | 12/1974 | United Kingdom . | |

*Primary Examiner*—John Zazworsky
*Attorney, Agent, or Firm*—Elizabeth E. Strnad; Richard P. Lange

[57] ABSTRACT

A soft clipping circuit particularly suited for use with audio signals avoids the need to use non-linear diode characteristics to determine the amount of clipping that is provided. A diode switching circuit which includes constant current sources is used to determine the output voltage of an amplifier at which clipping is to begin. Once this voltage is reached, the switching circuit disconnects the amplifier from a signal output terminal. At this time, the signal at the output terminal is determined solely by the values of resistors in a resistive dividing network connected between a signal input terminal and the output terminal.

8 Claims, 4 Drawing Sheets

PRECISION DEVICE FOR SOFT CLIPPING AC AND DC SIGNALS

BACKGROUND OF THE INVENTION

1. Field of the Invention

The present invention relates to a precision device for soft clipping AC and DC signals. Such a device could be used, for example, in an audio power amplifier to limit large amplitudes, while generating less harmonic distortion than would occur with uncontrolled clipping.

2. Description of the Related Art

Soft clipping permits the linear amplification of an audio signal up to a particular amplitude. Thereafter, instantaneous, automatic compression of larger signals is progressively performed. The term "soft clipping" thus refers to the fact that the output signal is not strictly limited to a maximum value as in conventional clipping circuits. Rather, once the output signal reches a threshold value, amplification of the input signal continues to occur, but with a reduced gain.

Several benefits result from the use of soft cliping. Among these are the instantaaneous recovery from peak inputs without the profuse harmonics associated with uncontrolled clipping, and an increase in the maximum input voltage before complete saturation occurs. Further features and advantages of the soft clipping approach for audio signals are discussed in the 1970 IEEE article "'Soft Limiting'in Audio Power Amplification" by Gerald E. Wentworth.

Typical prior art devices for effecting soft clipping have used the non-linearity of forward biased diodes to produce a transfer function that aapproximates a desired curve. For soft clipping, the transfer function is generally represented by a curve of decreasing slope. This approach has inherent limitations, however. For example, the amplitude at which clipping occurs is restricted since the diode voltages are limited. In addition, the accuracy of the transfer curve associated with the soft clipping device is dependent on the diode transfer curve.

British Pat. Publication No. 1,376,961 discloses a DC function generator for producing an input-output characteristic which is set to approximate a desired curve. A plurality of diode equivalent circuits are connected in parallel between the input of an operational amplifier and a summing circuit. Each such circuit is biased to conduct with a particular resistance at a particular input voltage amplitude. With this arrangement, a piecewise linear approximation of a desired transfer curve can be obtained. Such a device entails the use of diode equivalent circuits, ech of which comprises an additional operational amplifier. The complexity of such circuitry renders it inefficient when the input signals are of AC type, such as audio signals, rather than the DC input signals for which it is designed. In addition, a precision voltage source is required for the diode equivalent circuit. The use of plural diodes in the operational amplifier feedback path is also plagued with associated inaccuracies. Although additional diodes can be introduced into the circuit to compensate for voltage drops across the primary diodes, these additional diodes can not be assumed to have matching characteristics which would eliminate all errors.

SUMMARY OF THE INVENTION

Accordingly, it is an object of the invention to overcome the deficiencies of the prior art and to provide an improved circuit foro soft clipping an AC or DC signal. In brief, a function generator is provided in which constant current sources and resistors are used to produce an accurate approximation of a non-linear transfer curve having desired soft clipping characteristics. The function generator includes an amplifier whose output terminal is selectively connected to a signal output terminal by means of a diode switching circuit. The diode switching circuit includes a pair of constant current sources which drive the diodes into conduction during normal operation. A negative feedback path is connected between the signal output terminal and an input terminal of the amplifier.

In operation, when the amplifier output signal is below a threshold voltage determined by the values of the constant current sources and the resistors, the output terminal of the amplifier is effectively connected to the signal output terminal. The circuit then functions as a normal negative feedback amplifier. However, when the amplifier output voltage exceeds the threshold voltage, some of the diodes in the switching circuit are driven to the cutoff state, and the amplifier is disconnected from the signal output terminal. In this situation the signal input terminal is connected to the signal output terminal only by means of a resistive divider network. The values of the resistors in this network can be chosen to provide the desired soft clipping effect to the input signal.

Although the function generator of the present invention includes a diode switching circuit for soft clipping the audio signal, the diodes to not determine the threshold value at which to initiate clipping. The transfer function for the clipping operation itself is established independently of the diode characteristics. The device of the present invention thus allows a wide range of amplitudes, while providing enhanced precision and repeatability. Furthermore, it offers greater flexibility in the choice of transfer functions that are obtainable.

BRIEF DESCRIPTION OF THE DRAWING

Other features and objects of the present invention will become more apparent from a reading of the following Detailed Description in conjunction with the drawings in which:

FIG. 2 shows a transfer function associated with the operation of FIG. 1a;

DETAILED DESCRIPTION

Figure 1A:
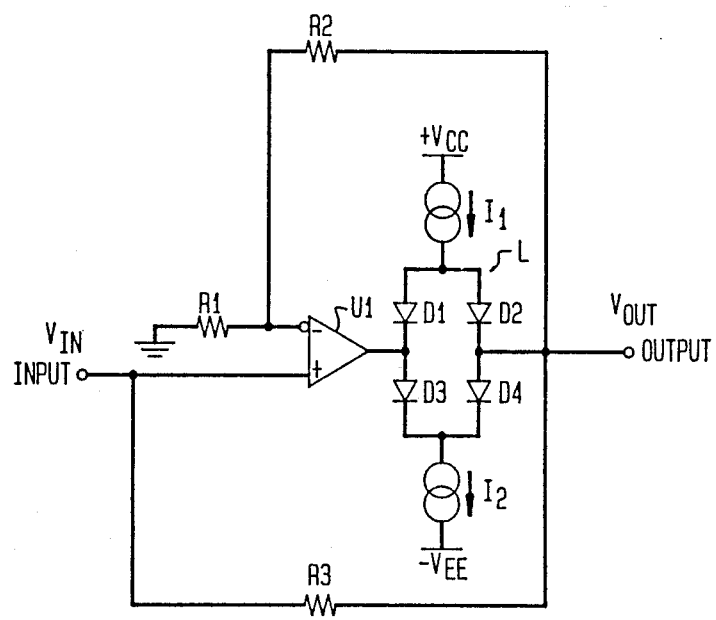
FIG. 1a shows a basic arrangement of the elements for one embodiment of the present invention.

Referring now to the drawings, there is shown in FIG. 1a the basic configuration of a function generator which operates as a soft clipping circuit in accordance with the teachings of the present invention. In FIG. 1a, an operational amplifier U1 is connected to receive an input signal at its non-inverting input terminal. The inverting input terminal of the operational amplifier is connected through a resistor $R_1$ to ground.

At the output terminal of the operational amplifier is a limiter circuit L. This circuit includes a diode switching circuit consisting of a first pair of serially connected diodes D1 and D3, a second pair of serially connected diodes D2 and D4 and two constant current sources $I_1$ and $I_2$.

The two pairs of diodes are oriented in the same direction and are placed in parallel arrangement with one another to form a diode bridge. The anodes of the diodes D1 and D2 are commonly connected to the positive constant current source $I_1$ and a voltage source $+V_{cc}$. The cathodes of the diodes D3 and D4 are commonly connected to the negative constant current source $I_2$ and a voltage source $-V_{EE}$. The output terminal of the operational amplifier U1 is connected to the junction established by the cathode of the diode D1 and the anode of the diode D3. The junction established between the cathode of the diode D2 and the anode of the diode D4 serves as the output terminal of the soft clipping circuit.

Two resistors, $R_2$ and $R_3$, are connected in feedback paths from the output terminal of the soft clipping circuit to the inverting and non-inverting input terminals, respectively, of the operational amplifier U1. The negative feedbck for the amplifier thus comprises the resistors $R_1$ and $R_2$ connected to ground. The resistors $R_1$ to $R_3$ constitute a voltage divider for applying a paortion of the input signal to the output terminal of the circuit. By appropriately selecting the values of the constant current sources $I_1$ and $I_2$, and the resistors $R_1$, $R_2$ and $R_3$, a desired transfer function for the soft clipping circuit can be generated as discussed hereinafter.

In operation, an input signal such as an audio signal is applied to the non-inverting input terminal of the operational amplifier U1. For low amplitude signals greater than $-V_{EE}$ but less than $+V_{cc}$, the diodes D1 through D4 are forward biased. Accordingly, the path from the output terminal of the amplifier U1 through the limiter L effectively provides feedback for the amplifier U1. The circuit shown in FIG. 1a thus functions as a simple non-inverting amplifier with a gain of $(1+R2/R1)$.

As the amplitude of the signal applied to the noninverting input terminal of the amplifier U1 increases, the voltage at the output terminal of the amplifier U1 increases. Therefore, the current supplied by the constant current sources I1 and I2 to a load, $R_{load}$, also increases. In this circuit, $R_{load}$ consists of the resistors $R_1$, $R_2$ and $R_3$.

This increase in load current through the resistors R1, R2 and R3 takes current away from two of the diodes in the bridge, and biases them toward cutoff. For example, if the voltage at the output terminal of the amplifier U1 is positive, an increased current will flow through the diodes D2 and D3, and the diodes D1 and D4 will be biased toward cutoff. If the voltage at the output terminal of the amplifier U1 is negative, the increased current will flow through the diodes D1 and D4, thus biasing the diodes D2 and D3 toward cutoff.

When the output voltage of the amplifier increases to the point that all of the current from the current sources $I_1$ and $I_2$ is supplied to the load, $R_{load}$, two of the diodes in the bridge (depending on the voltage polarity) will turn off completely. This in turn will cause the feedback loop of the amplifier U1 to open. At this point, the voltage gain of the soft clipping circuit changes to $(R1+R2)/(R1+R2+R3)$.

From the above discussion, it can be appreciated that the diode switching circuit will effectively provide a signal path from the output terminal of the amplifier U1 to the output terminal of the function generator circuit when the magnitude of the amplifier output signal is below a pre-established threshold level. The soft clipping circuit therefore functions as a normal negative feedback amplifier. In operation, the diodes are used only as switches, with the pre-established threshold being precisely determined by the values of the constant current sources and the resistors. Once the magnitude of the amplifier output signal rises above this threshold level, some of the diodes in the switching circuit are driven to the cutoff state such that the diode switching circuit will disconnect this signal path and alter the gain of the function generator. In this situation, the signal input terminal is connected to the signal output terminal of the soft clipping circuit only by means of a resistive divider network.

Figure 2:
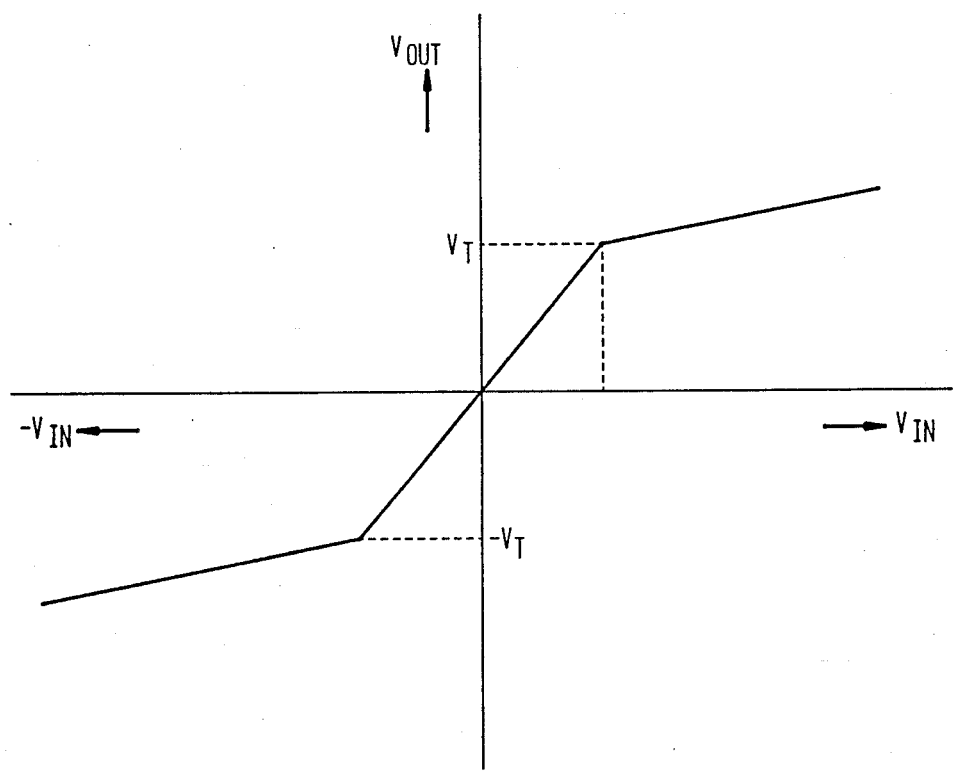

FIG. 2 shows a transfer curve associated with the operation of the FIG. 1a circuit. When the magnitude of the output voltage is less than a threshold value, the diodes D1 through D4 conduct. Thus, the input/output relationship of the circuit shown in FIG. 1a has a slope of $(1+R2/R1)$ near the origin. When the output voltage of the amplifier U1 rises to $V_T$, two of the diodes (depending on the polarity) will be cut off. This opens the loop of the amplifier U1 through the limiter L and decreases the slope of the transfer curve to the value $(R1+R2)/(R1+R2+R3)$. For a positive input voltage, the value of $V_T$ is equal to $(I_1.R_{Load})$. Likewise, for a negative input voltage, $V_T = I_2.R_{Load}$.

In a preferred embodiment of the circuit shown in FIG. 1a, $I_1$ is equal to $I_2$, and therefore the transfer function for the circuit is symmetrical for positive and negative values of $V_{IN}$, as shown in FIG. 2.

Thus, it can be appreciated that the threshold voltage $V_T$ for the soft clipping is determined by the constant current source output and the resistive load. The transfer curve for the circuit is not dependent on the diode characteristics in any way.

Figure 1B:
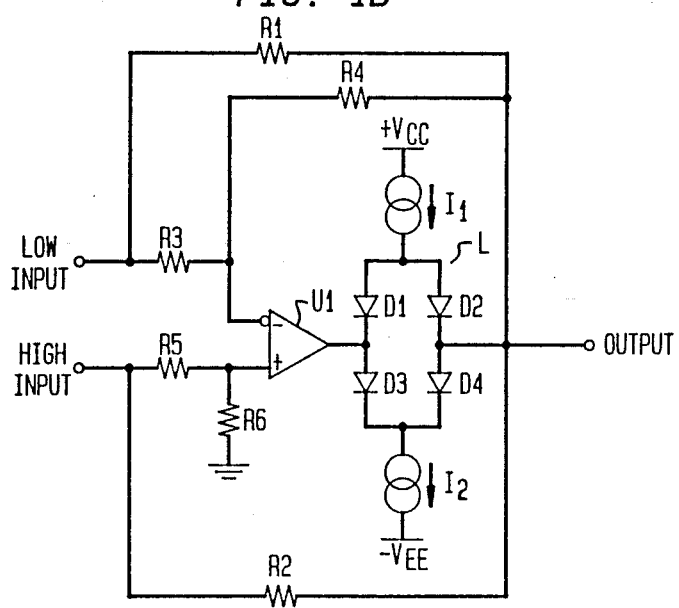
FIG. 1b shows a second embodiment of the present invention, comprising a generic transfer function generator.

FIG. 1b shows a generic transfer function generator employing the principles of the present invention. This generator can be used to produce a transfer function having either positive slopes, negative slopes, or both positive and negative slopes.

Referring to FIG. b, the basic circuit comprises the operational amplifier U1 connected to an output terminal through the diode switching circuit formed of the diodes D1 to D4. The diode switching circuit is connected to the constant current sources $I_1$ and $I_2$ as discussed with respect to FIG. 1a.

A high input signal is applied to the non-inverting terminal of the differential amplifier U1 through a voltage divider comprised of two resistors R5 and R6. A low input signal is applied to the inverting terminal of the amplifier U1 through a resistor R3. A feedback resistor R4 is connected in series with the resistor R3 between the output terminal of the function generator and the low input signal. The resistors R3 and R4 thus combine to provide negative feedback to the low input terminal of the differential amplifier U1. Additional resistors R1 and R2 are provided between the output terminal of the diode bridge and each of the low and high input signals, respectively, to produce the desired transfer function.

In operation, the diode switching circuit will provide a signal path from the output terminal of the differential amplifier U1 in FIG. 1b to the output terminal of the function generator when the magnitude of the output from the amplifier U1 is below a pre-established threshold level. When the magnitude of the ouput exceeds this threshold level, the signal path provided by the diode switching circuit is disconnected.

Figure 3A:
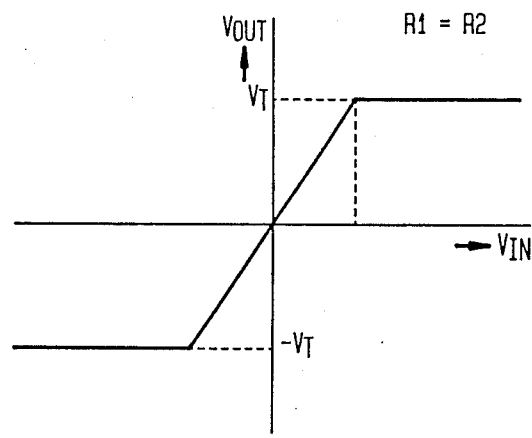
FIGS. 3a–c show transfer function associated with the operation of FIG. b.

The resistors R1 to R4 constitute a voltage divider for applying a portion of the differential input signal to the output terminal of the functional generator. The values selected for the resistors R1 to R4 will thus dictate the gain of the function generator for the open state of the diode switching circuit. In addition, by properly selecting the relaative values of the resistors R1 and R2, a desired transfer function having either positive and/or negative slopes can be produced. For example, if the resistor R1 is made equal to the resistor R2, the circuit initially operates as a typical differential amplifier having a constant slope. When the output voltage of the amplifier U1 exceeds the value $V_T$, the path from the amplifier U1 to the output terminal of the diode bridge opens, and a hard limit is imposed as shown in FIG. 3a.

Figure 3B:
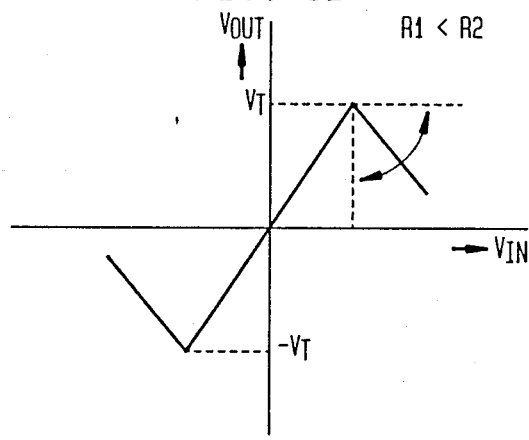

If the resistor R1 is chosen to be of a value less than R2, the circuit initially operates as a differential amplifier having a transfer function with a positive slope (FIG. 3b). However, when the output of the amplifier U1 exceeds the threshold $IV_T$, the transfer function is defined by a line segment having a negative slope. The magnitude of this slope depends on the difference in value of the resistors R1 and R2.

Figure 3C:
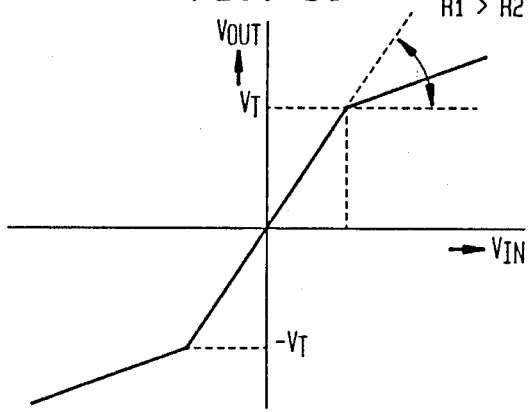

FIG. 3c shows the transfer function of the FIG. 1b circuit when the value of the resistor R1 is chosen to be greater than that of the resistor R2. Because the path from the amplifier U1 to the output terminal of the diode switching circuit again opens when the output signal of the amplifier U1 exceeds $V_T$, the slope of the transfer function changes at $V_T$. Although the slope remains positive, the actual slope of the transfer function when the output signal from the amplifier U1 is greater than $V_T$ depends on the relaative values of R1 and R2.

As discussed above, the diode switching circuit of FIG. 1b responds to the magnitude of the amplifier output signal relative to a pre-established threshold. This threshold is determined by the resistive load comprising the resistors R1–R4, and the constant current sources $I_1$ and $I_2$. Since this threshold is established independently of diode characteristics, the accuracy and repeatability of a function generator of the type illustrated in FIG. 1b is enhanced.

Figure 4:
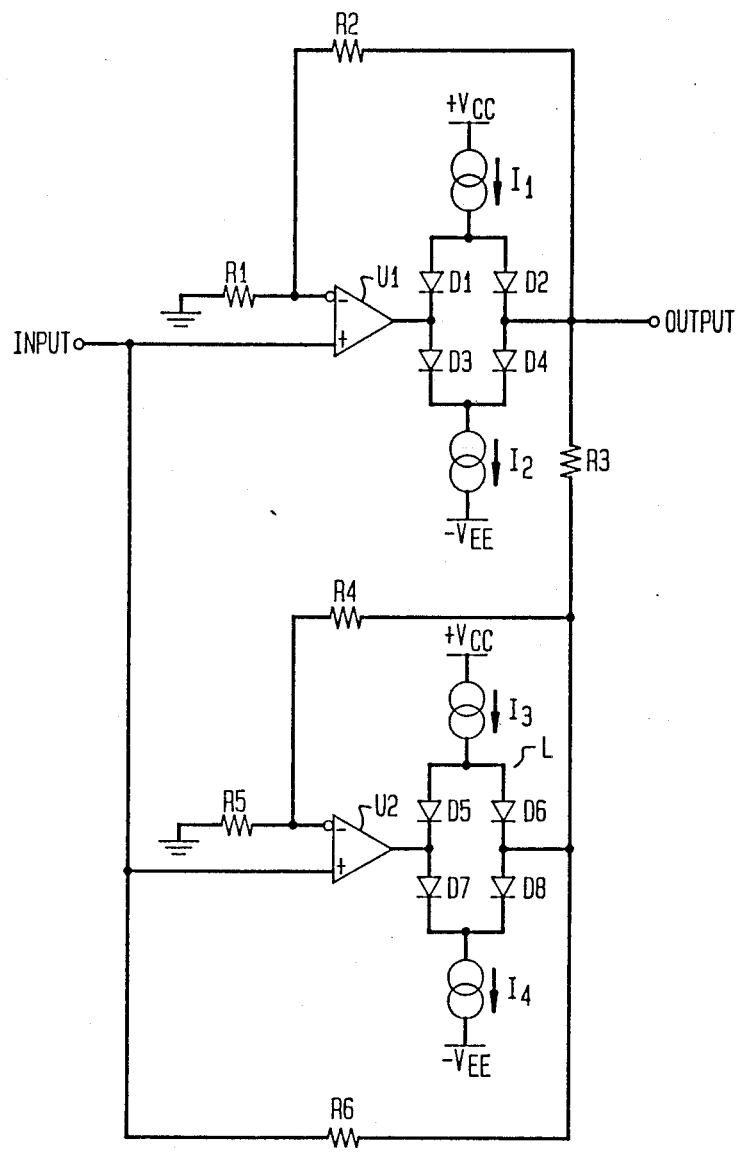
FIG. 4 shows an additional embodiment of the present invention in which accuracy is improved.

FIG. 4 discloses a manner in which the piecewise linear approximation provided by the function generator of the present invention can be further improved. More specifically, by cascoding a plurality of the function generator circuits of the type shown in FIG. 1, for example, a more precise piecewise linear approximation can be obtained. FIG. 4 illustrates this particular arrangement whereby two of the function generators disclosed in FIG. 1a are cascoded. In addition to the circuit disclosed in FIG. 1a, a second circuit comprising an operation amplifier U2, resistors R4 to R6, diodes D5 to D8 and current sources $I_3$ and $I_4$ is provided. The second circuit is interposed in the feedback path of the FIG. 1a circuit between the noninverting input terminal of the amplifier U1 and the resistor R3. Additional cascoding of circuits could be used to further improve the piecewise approximation of any desired transfer function.

Although the present invention has been fully described by way of example with reference to the accompanying drawings, it should be noted that various changes and modifications will be apparent to those skilled in the art. Therefore, unless such changes and modifications depart from the scope of the present invention, they should be construed as being included withiin the scope of the appended claims.

What is claimed is:

1. An apparatus for soft clipping AC and DC signals, comprising:
    amplifier means having an inverting and non-inverting input, respectively, said non-inverting input receiving an input signal;
    a diode switching circuit coupled to an output of said amplifier means for connecting an output signal of said amplifier means to an output terminal of said apparatus when a magnitude of said output signal is below a threshold level, and for disconnecting said output signal from said output terminal when said magnitude is above said threshold level; and
    purely resistive voltage divider means having a linear transfer function, for applying a portion of said input signal to said output terminal, said voltage divider means comprising a first feedback resistor coupled between said output terminal and said inverting input of said amplifier means, and a second feedback resistor coupled between said output terminal and said non-inverting input of said amplifier means.

2. The apparatus of claim 1, wherein said voltage divider means further comprises a third resistor coupled between said inverting input of said amplifier means and ground.

3. The apparatus of claim 1, wherein said amplifier means comprises a differential amplifier circuit having a first and second input terminal that receive a differential input signal, and said non-inverting input of said amplifier means coupled to said first input terminal, and said inverting input coupled to said second input terminal; and wherein
    said voltage divider means further comprises a fourth resistor coupled between said inverting input and said second input terminal, a fifth resistor coupled between said second input terminal and said output terminal, a sixth resistor coupled between said non-inverting input and first terminal, and a seventh resistor coupled between said non-inverting input and ground.

4. The apparatus of claim 1, wherein said diode switching circuit comprises:
    two pairs of series-connected diodes connected in parallel;
    a positive current source coupled to a junction between respective anodes of said pairs of series connected diodes;
    a negative current source coupled to a junction between respective cathodes of said pairs of series connected diodes; and wherein
    a junction between respective diodes of one of said two pairs is coupled to said output of said amplifier means, and a function between respective diodes of the other of said two pairs is coupled to said output terminal of said apparatus.

5. The apparatus of claim 1, wherein said voltage divider means includes at least one additional amplifier means and diode switching circuit.

6. The apparatus of claim 2, wherein said voltage divider means includes at least one additional amplifier means and diode switching circuit coupled between said non-inverting input terminal and said second resistor means.

7. An apparatus for soft clipping AC and DC signals, comprising:
   an inverting operational amplifier means having a non-inverting input receiving an input signal;
   a diode switching circuit coupled to an output of said amplifier means for applying an output signal of said amplifier means to an output terminal of said apparatus when a magnitude of said output signal is below a threshold level, and for disconnecting said output signal from said output terminal when said magnitude is above said threshold level; and
   purely resistive voltage divider means having a linear transfer function, for applying a portion of said input signal to said output terminal, said voltage divider means comprising a first feedback resistor coupled between said output terminal and said inverting inpu of said amplifier means, a second feedback resistor coupled between said output terminal and said non-inverting input of said amplifier means, and a third resistor coupled between said inverting input and ground.

8. An apparaatus for soft clipping AC and DC signals, comprising:
   a differential amplifier ciricuit having a first and second input terminal that receive a differential input signal, a differential operational amplifier means having a non-inverting input coupled to said first input terminal, and an inverting input coupled to said second input terminal;
   purely resistive voltage divider means having a linear transfer function, for applying a portion of said input signal to said output terminal, said voltage divider means comprising a first feedback resistor coupled between said output terminal and said inverting input of said amplifier means, a second feedback resistor coupled between said output terminal and said first input terminal, a third resistor coupled between inverting input and said second input terminal, a fourth resistor coupled between said second input terminal and said output terminal, a fifth resistor coupled between said non-inverting input and first terminal, and a seventh resistor coupled between said non-inverting input and ground.

* * * * *